(12) United States Patent
Juliano et al.

(10) Patent No.: US 7,569,123 B1
(45) Date of Patent: Aug. 4, 2009

(54) OPTIMIZING TARGET EROSION USING MULTIPLE EROSION REGIONS IN A MAGNETRON SPUTTERING APPARATUS

(75) Inventors: Daniel R. Juliano, Santa Clara, CA (US); Douglas B. Hayden, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 941 days.

(21) Appl. No.: 10/853,034

(22) Filed: May 25, 2004

(51) Int. Cl.
*C23C 14/00* (2006.01)
*C23C 14/32* (2006.01)

(52) U.S. Cl. ............................. 204/192.13; 204/192.33
(58) Field of Classification Search ............ 204/192.12, 204/298.12
See application file for complete search history.

(56) References Cited

U.S. PATENT DOCUMENTS

| | | | |
|---|---|---|---|
| 4,622,121 A | 11/1986 | Wegmann et al. | |
| 4,865,712 A | 9/1989 | Mintz | |
| 5,171,415 A | 12/1992 | Miller et al. | |
| 5,188,717 A | 2/1993 | Broadbent et al. | |
| 5,252,194 A | 10/1993 | Demaray et al. | |
| 5,314,597 A | 5/1994 | Harra | |
| 5,482,611 A | 1/1996 | Helmer et al. | |
| 5,593,551 A | 1/1997 | Lai | |
| 6,024,843 A * | 2/2000 | Anderson et al. | 204/192.12 |
| 6,179,973 B1 | 1/2001 | Lai et al. | |
| 6,193,854 B1 | 2/2001 | Lai et al. | |
| 6,217,716 B1 * | 4/2001 | Fai Lai | 204/192.12 |
| 6,444,105 B1 | 9/2002 | Lai et al. | |
| 6,451,177 B1 * | 9/2002 | Gopalraja et al. | 204/192.12 |
| 6,464,841 B1 * | 10/2002 | Hurwitt | 204/192.12 |
| 6,471,831 B2 | 10/2002 | Lu et al. | |
| 6,497,796 B1 | 12/2002 | Ashtiani et al. | |
| 6,500,321 B1 * | 12/2002 | Ashtiani et al. | 204/298.12 |
| 6,613,199 B1 | 9/2003 | Tobin et al. | |
| 2003/0173215 A1 * | 9/2003 | Wang | 204/298.12 |

OTHER PUBLICATIONS http://www.merriam-webster.com/dictionary/flared [Accessed on Jun. 9, 2008].*

* cited by examiner

*Primary Examiner*—Alexa D Neckel
*Assistant Examiner*—Michael Band
(74) *Attorney, Agent, or Firm*—Okamoto & Benedicto LLP

(57) ABSTRACT

In one embodiment, the erosion profile of a shaped target (e.g., hollow cathode target) of a magnetron apparatus is enhanced by using a plurality of sputtering tracks, such as plasma loops, on the target. The erosion profile may be optimized by recording the erosion profile and making adjustments to the magnetic configuration of the magnetron. The recording may include two-dimensional plots of erosion/redepostion rates or a grid overlay tracing of a static burn test, for example. The magnetic configuration of the magnetron may include a rotating magnetic array. The rotating magnetic array may be adjusted to change the shape or location of the plurality of plasma loops to achieve an optimum erosion profile. The target may have a flared lip to increase erosion on the lip, if needed.

8 Claims, 12 Drawing Sheets

OPTIMIZING TARGET EROSION USING MULTIPLE EROSION REGIONS IN A MAGNETRON SPUTTERING APPARATUS

BACKGROUND OF THE INVENTION

1. Field of the Invention

The present invention relates generally to integrated circuit fabrication equipment, and more particularly but not exclusively to magnetron sputtering.

2. Description of the Background Art

Magnetron sputtering, in general, is well known in the art of integrated circuit fabrication. A magnetron sputtering apparatus includes a target comprising a material to be deposited on a substrate. The substrate, which may be a semiconductor wafer, is located a distance away from the target. To coat the substrate with the target material, plasma of a gas suitable for sputtering is maintained between the target and the substrate. When ions of the sputtering gas hit the target, atoms of the target material are dislodged from the target and onto the substrate.

A target is considered a consumable item because it is eroded during the sputtering process. Unfortunately, a target is a relatively expensive component of a magnetron apparatus. Techniques for increasing the service life of a target are generally desirable because they help lower the cost of ownership of a magnetron apparatus.

It is also generally desirable to erode the entire surface of a sputtering target. If this does not occur, the locations on the target that are not eroded can accumulate, material sputtered from other areas of the target. Depending on the target material and sputtering conditions, this redeposited material can generate particles that can cause manufacturing defects in the wafers processed through the magnetron.

SUMMARY

In one embodiment, the erosion profile of a shaped target (e.g., hollow cathode target) of a magnetron apparatus is enhanced by using a plurality of sputtering tracks, such as plasma loops, on the target. The erosion profile may be optimized by recording the erosion profile and making adjustments to the magnetic configuration of the magnetron. The recording may include two-dimensional plots of erosion/redeposition rates or a grid overlay tracing of a static burn test, for example. The magnetic configuration of the magnetron may include a rotating magnetic array. The rotating magnetic array may be adjusted to change the shape or location of the plurality of plasma loops to achieve an optimum erosion profile. The target may have a flared lip to increase erosion on the lip, if needed.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided such as examples of apparatus, components, and methods, to provide a thorough understanding of embodiments of the invention. Persons of ordinary skill in the art will recognize, however, that the invention can be practiced without one or more of the specific details or by using alternatives. For example, magnets shown as permanent magnets may be replaced by electromagnets (i.e., coils) and vice versa. In other instances, well known details are not shown or described to avoid obscuring aspects of the invention.

The erosion profile of a magnetron target is dependent on a combination of factors. For a planar target operating at low pressure, redeposition is not much of a concern because very little of the sputtered material ends up back on the target. But for a shaped (i.e., non-planar) target, such as that used in a hollow cathode magnetron (HCM) apparatus, the net erosion at any point on the target surface is the difference between the sputtering at that point and the redeposition arriving at that point from other areas of the target. Because of this redeposition, it is typically the case that part of the shaped target surface will erode while the rest accumulates redeposited material. Examples of shaped targets include those disclosed in U.S. Pat. Nos. 6,179,973 and 6,497,796, which are both incorporated herein by reference in their entirety.

Figure 1:
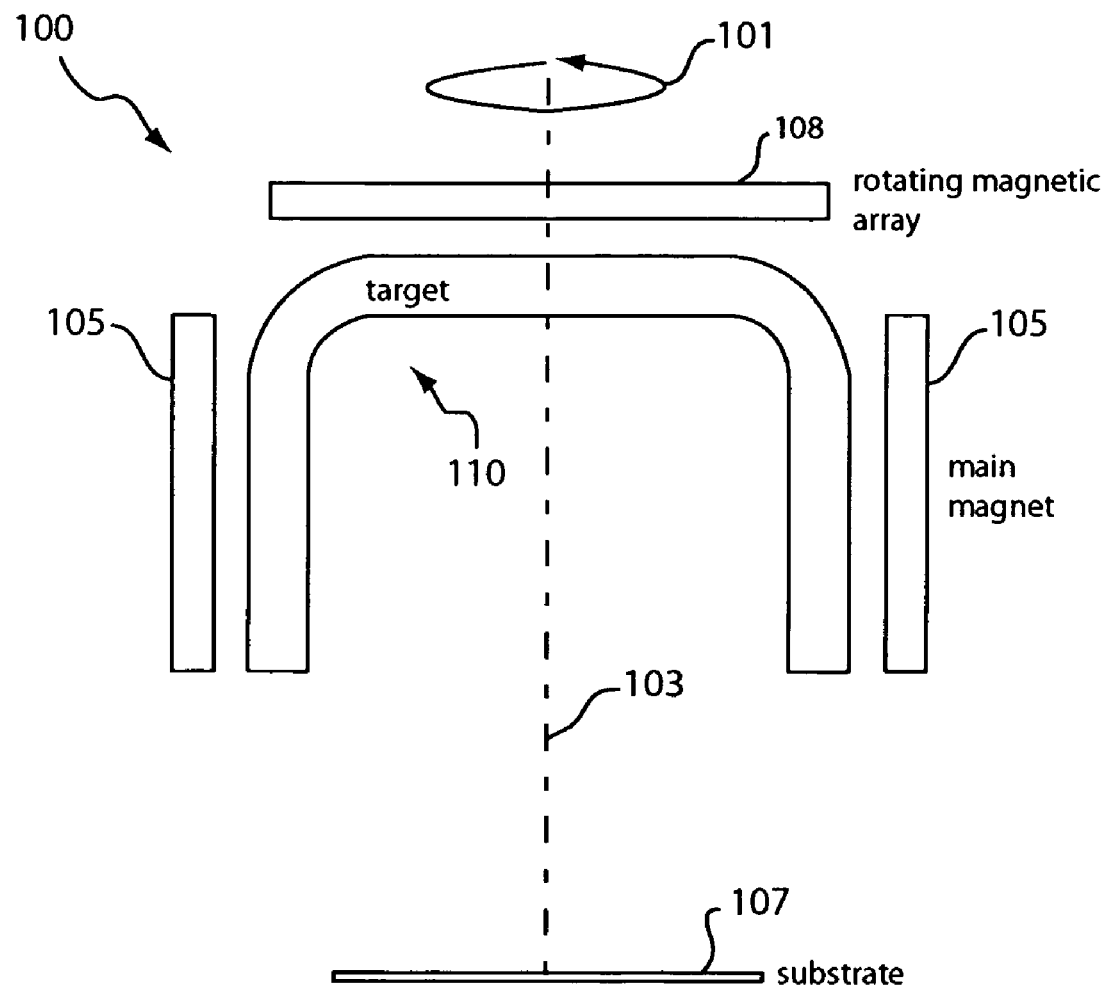
FIG. 1 shows a schematic diagram of a conventional hollow cathode magnetron.

FIG. 1 shows a schematic diagram of a conventional hollow cathode magnetron (HCM) 100, which includes a shaped target 110, main magnet 105, and rotating magnetic array 108. Main magnet 105 generates main magnetic fields to confine plasma within target 110 and to controllably allow sputtered target material to reach a substrate 107 (e.g., semiconductor wafer). Magnet array 108 is rotated to create magnetic fields that help enhance the erosion profile of target 110. As indicated by arrow 101, HCM 100 is cylindrically symmetric about an axis 103. In the example of FIG. 1, target 110 is cup-shaped and is also referred to as a "hollow cathode." In a hollow cathode, the closed end of the cup is referred to as "dome," the open end is referred to as "mouth," the surrounding wall is referred to as "sidewall," the corner between the sidewall and the dome is referred to as "corner," and the sidewall portion near the mouth is referred to as "lip." The sputtering surface of target 110, which is simply referred to as "surface," is that portion of target 110 facing substrate 107. Techniques for controlling erosion profile in hollow cathode magnetrons are also disclosed in U.S. Pat. No. 6,193,854, which is incorporated herein by reference in its entirety.

Figure 2:
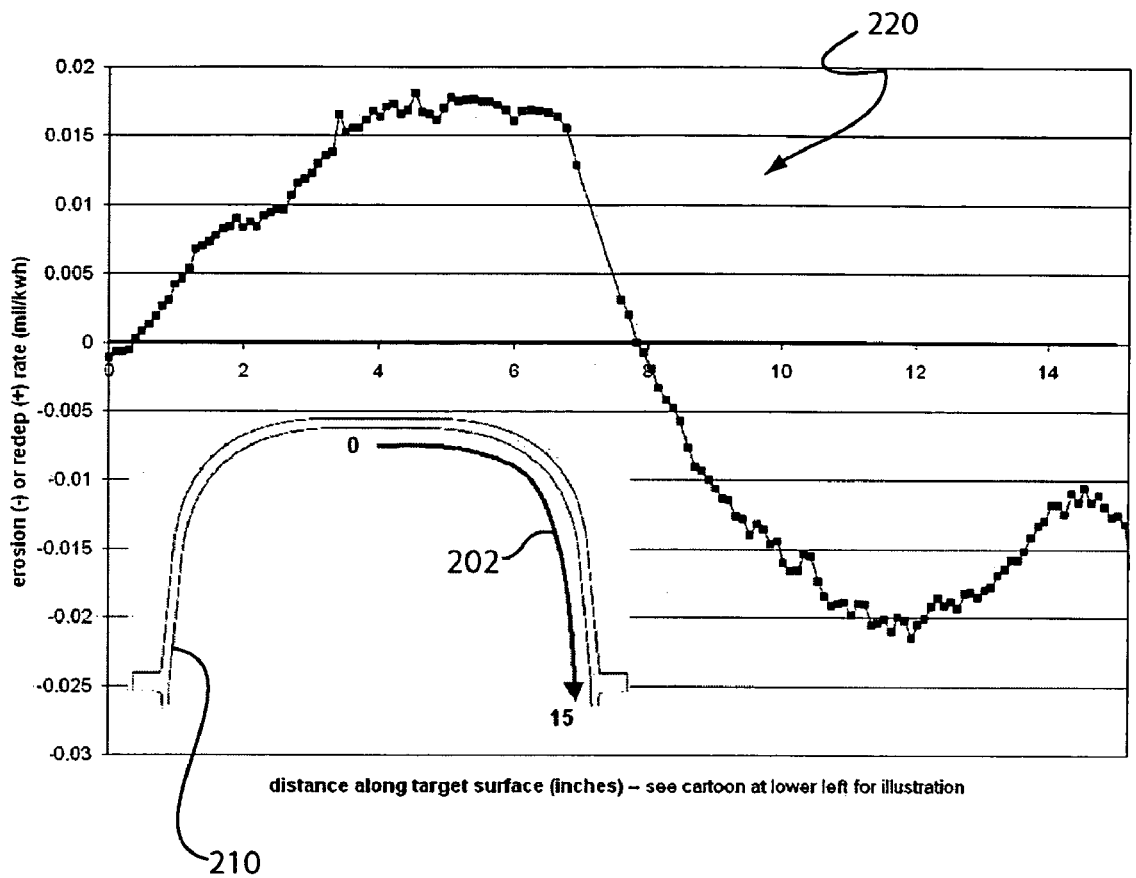
FIG. 2 shows a plot of an erosion profile of a hollow cathode target.

FIG. 2 shows a plot of an erosion profile 220 of a hollow cathode target 210. Target 210 is schematically drawn on the lower left corner of erosion profile 220 for ease of understanding. In one embodiment, erosion profile 220 is generated by taking precise measurements of the sputtering surface of target 210 before and after a sputtering process. That is, erosion profile 220 may be generated by taking first measurements of the surface of target 210, then sputtering target 210 for an extended period of time, and then taking second measurements of the surface of target 210. Erosion and redeposition rates may be determined by taking the difference between the first and second measurements. The sputtering surface of target 210 may be measured using a coordinate measuring machine (CMM), for example. As can be appreciated, the just described technique may be advantageously employed in the evaluation, and hence fine tuning, of the erosion profile of a target.

In the example of FIG. 2, the horizontal axis represents a position along target 210 labeled by arrow 202. The numbers on arrow 220 and the horizontal axis are in inches. The vertical axis represents the redeposition (positive value) or erosion (negative value) rate on the sputtering surface of target 210. Erosion profile 220 shows that the sputtering process erodes a tiny spot in the center (e.g., at about 0 to 0.5 inch) of the dome of target 210, then redeposits over a large band across the rest of the dome and corner (at about 0.5 inch to 8 inches), and finally erodes the sidewall and lip area (at about 7 to 15 inches) of target 210. In the context of profile 220, "more erosion" refers to a number that is more negative, and therefore closer to the bottom of the plot.

Eroding the entire sputtering surface of a target, a condition referred to as "full face erosion," advantageously lengthens the service life of the target. Full face erosion may be achieved by balancing the sputtering and redeposition rates at all points on the target surface such that sputtering rates slightly exceed redeposition rates. Full face erosion not only lengthens the service life of the target, but also aids reliability in that redeposited material will otherwise build up and eventually flake off, causing particle problems. Full face erosion is particularly difficult to achieve in a shaped target because much of the material sputtered from the target surface lands back on the target. This is illustrated in FIG. 3 where arrow bursts at the dome, corner and mouth of target 210 schematically indicate possible ejection angles of sputtered atoms.

Figure 3:
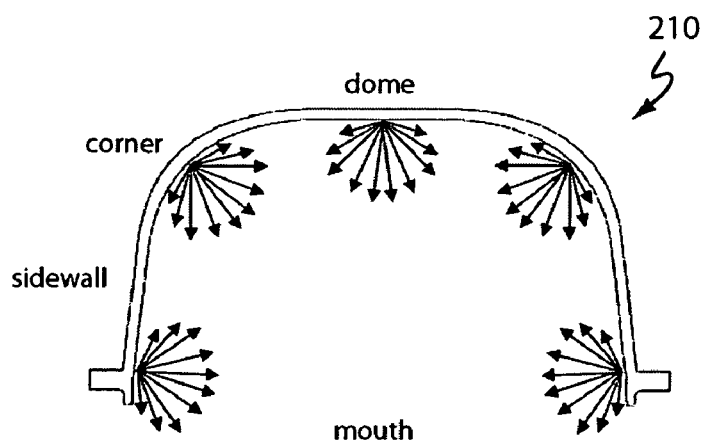
FIG. 3 pictorially illustrates the ejection angles of sputtered atoms in a shaped target.

FIG. 3 illustrates that a majority of the sputtered atoms will land back oh the target, where they will redeposit. That means the net erosion at a point on the target surface is the small difference between two large quantities (sputtering minus redeposition) at that point. A small change to either the sputtering or the redeposition at a point on the target makes a large change in the net erosion rate at that point. Preferably, the sputtering rate at every point on the target is balanced against the redeposition occurring at the same point in such a way that the balance is just barely tipped toward erosion.

Figure 4:
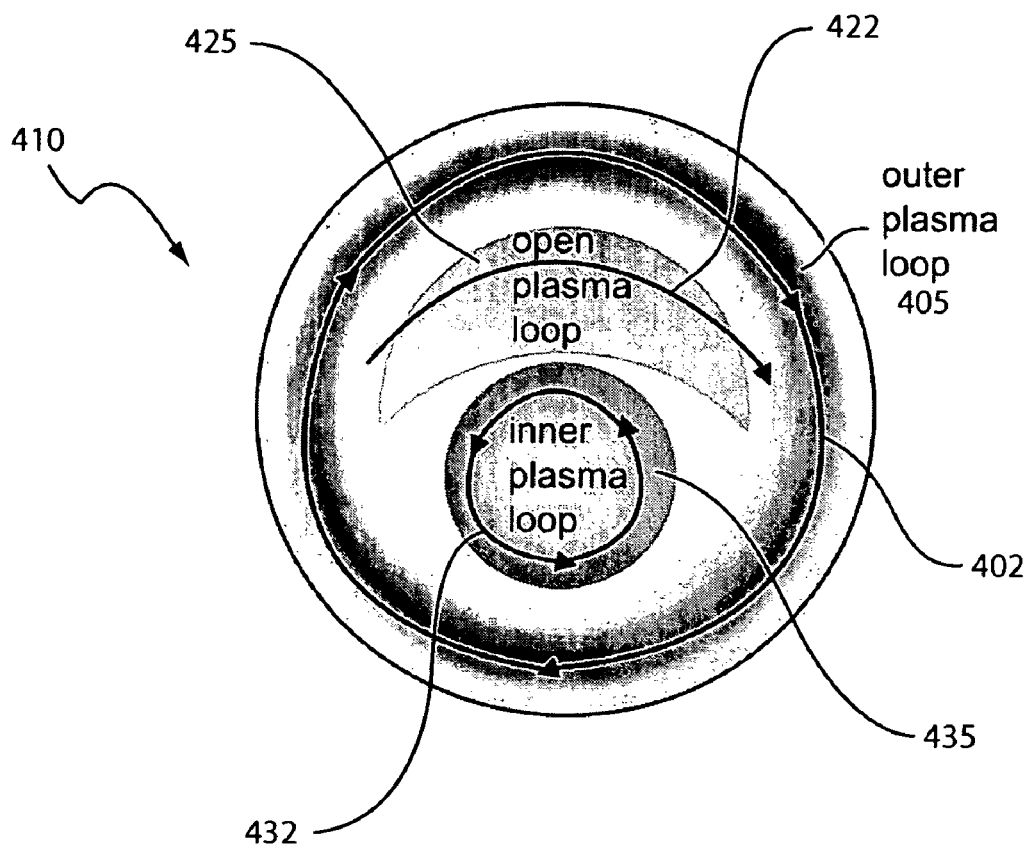
FIG. 4 pictorially illustrates the use of several plasma loops to sputter a target, in accordance with an embodiment of the present invention.

One way of achieving full face erosion is by using multiple erosion regions that can be adjusted relatively independently of one another. For example, the sidewall of a hollow cathode target may be eroded by a ring of plasma that is confined to the sidewall area. The dome area of the target may be eroded by a ring of plasma that is constrained to the dome and is confined by fields that mostly emanate from a rotating magnetic array at the top of the target. The corner area of the target may be eroded by a branch of plasma that extends from the sidewall plasma, crosses the corner, and is returned to the sidewall. The aforementioned plasmas in the dome, sidewall, and corner portions of the target may be created by three different magnetic arrays and may be separated by magnetic separatrices, allowing the erosion in these three different regions to be adjusted somewhat independently. FIG. 4 schematically shows examples of these three different plasma regions on a hollow cathode target 410, in accordance with an embodiment of the present invention.

In the example of FIG. 4, hollow cathode target 410 has been "flattened" for clarity of illustration. The different plasma regions on target 410 comprise an outer plasma loop 405, an open plasma loop 425, and an inner plasma loop 435. These plasma loops form sputtering tracks that erode the target surface. Plasma loops 405, 425, and 435 erode the sidewall, corner, and dome regions, respectively, of target 410. Arrows 402, 422, and 432 indicate plasma flow direction, and are primarily due to ExB (cross product of electric and magnetic fields) drift.

For purposes of the present disclosure, an "open plasma loop" refers to a plasma loop that takes plasma from a first region, siphons that plasma through the open loop, and then releases that plasma into a second region. The first and second regions, which are not part of the open plasma loop, may be the same region. The just mentioned first and second regions may be a nearby volume, a closed plasma loop, or another open plasma loop. For example, plasma loop 425 is an open plasma loop in that it takes plasma from a surrounding volume, siphons that plasma through plasma loop 425 in the direction indicated by arrow 422, and then releases that plasma back to the surrounding volume. Plasma loops 405 and 435 are closed plasma loops that flow in the direction indicated by arrows 402 and 432, respectively. The formation and use of plasma loops as sputtering tracks are also disclosed in U.S. application Ser. No. 10/735,987, filed on Dec. 15, 2003.

Figure 5:
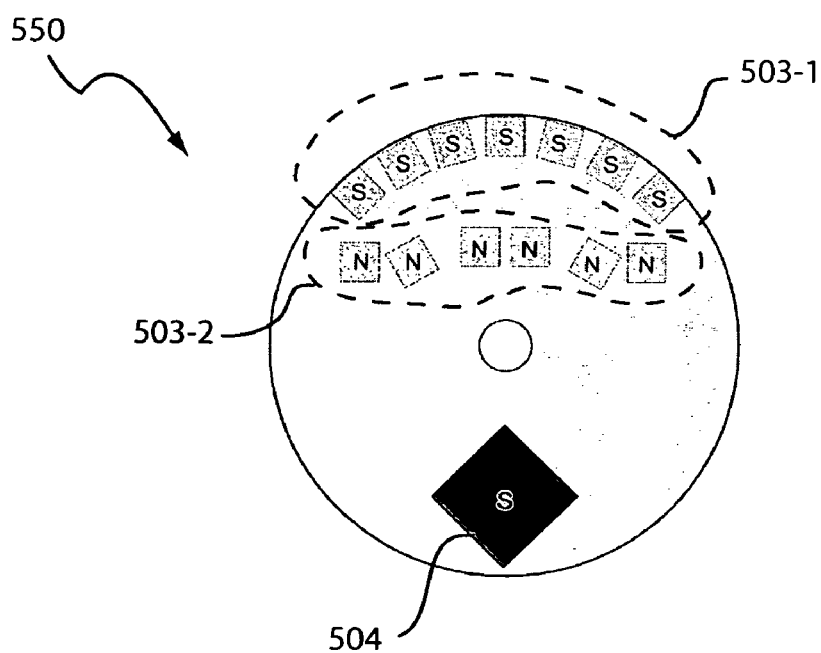
FIG. 5 shows a schematic diagram of a rotating magnetic array in accordance with an embodiment of the present invention.

The plasmas shown in the example of FIG. 4 may be formed using any suitable magnetic circuit without detracting from the merits of the present invention. One way of forming plasma loops 425 and 435 is to use an appropriately configured rotating magnetic array on top of the target. An example of such a rotating magnetic array in accordance with an embodiment of the present invention is rotating magnetic array 550, which is schematically shown in FIG. 5. Magnetic array 550 may be used instead of magnetic array 108 in HCM 100 (see FIG. 1). The use of magnetic array 550 in other magnetron apparatus is further discussed below. Magnetic array 550 may be rotated using a motor (not shown), for example.

Magnetic array 550 may comprise a magnet 504 and a magnetic circuit 503. Magnetic circuit 503, in turn, may comprise magnets 503-1 and 503-2. In one embodiment, the magnets of circuit 503 and magnet 504 are oriented roughly perpendicularly to the face of the target. FIG. 5 shows the poles of magnetic circuit 503 and magnet 504 as seen by the target. Magnetic circuit 503 may be configured to form an open plasma loop, such as plasma loop 425 shown in FIG. 4. Magnet 504 interacts with a prevailing N field (e.g., those from later described magnets 1102 and 1103 of FIG. 11) to form an inner closed plasma loop, such as inner plasma loop 435 shown in FIG. 4.

In light of the foregoing, those of ordinary skill in the art will appreciate that although plasma loops 405, 425, and 435 of FIG. 4 do interact, they are largely localized and can be adjusted somewhat independently by appropriately fine tuning magnetic array 550. That is, plasma loops serve as sputtering tracks that may be somewhat independently adjusted to optimize an erosion profile. For example, the erosion profile may be optimized by measuring the erosion profile (e.g. erosion profile 220 shown in FIG. 2), making adjustments to a rotating magnetic array (e.g. magnetic array 550) based on the erosion profile, and iterating until the desired erosion profile is achieved. Another way is to perform a static burn test.

Figure 6:
FIG. 6 shows a photograph of the sputtering surface of a hollow cathode target.

FIG. 6 shows a photograph of the sputtering surface of a hollow cathode target 410 after a static burn. The photograph of FIG. 6 is a result of statically running the magnets of magnetic array 550 on top of the target 410. That is, sputtering was performed on the target 410 without rotating magnetic array 550. This static burn test advantageously results in quantifiable, visible regions of erosion and redeposition on the surface of the target 410. The static burn test allows the designer to see the static erosion profile across the target, rather than the time-averaged erosion profile one would get if the top magnetic array were rotating. Static burn tests are also disclosed in U.S. Pat. No. 5,314,597, which is incorporated herein by reference in its entirety.

Figure 7:
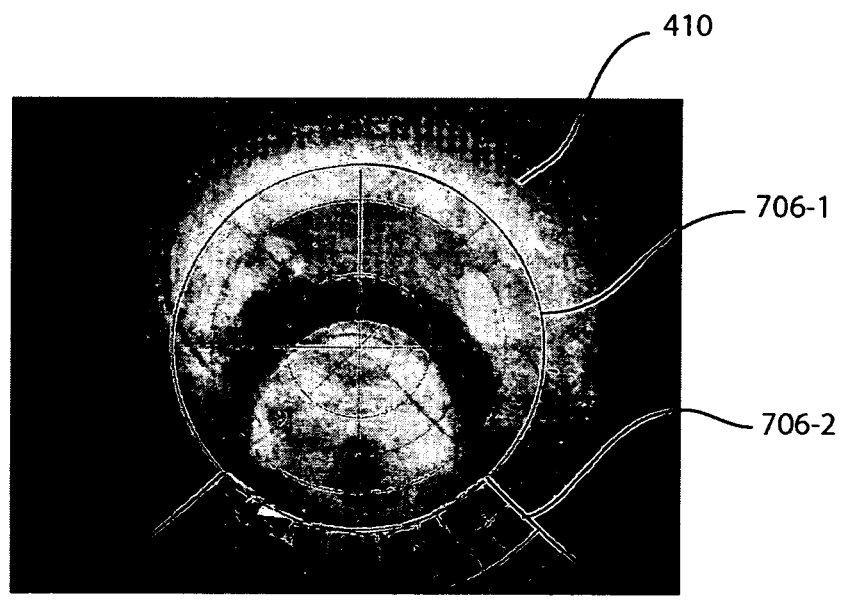
FIG. 7 illustrates the use of a grid overlay to map an erosion profile, in accordance with an embodiment of the present invention.

FIG. 7 shows the use of a grid overlay to map the erosion profile of a target, in accordance with an embodiment of the present invention. Grid overlay 706 may comprise a portion 706-1 for overlying over the dome area of a hollow cathode target, and a portion 706-2 for overlaying over the sidewall. As shown, overlay 706-2 covers only one quadrant of the sidewall. However, by repeatedly rotating the entire overlay 706 by 90 degrees, the entire target surface can be mapped in a piecewise fashion. In one embodiment, the circles of grid overlay 706 are one inch apart.

Figure 8:
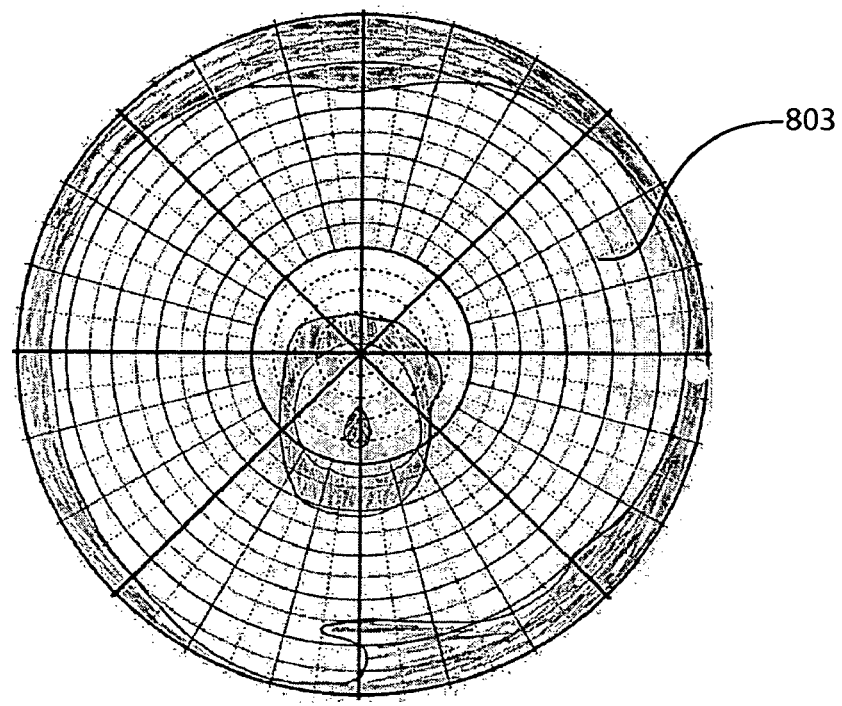
FIG. 8 shows an example tracing on a grid overlay for mapping an erosion profile, in accordance with an embodiment of the present invention.

Grid overlay 706 advantageously allows an overall static erosion profile to be mapped and recorded for analysis. In the example of FIG. 7, grid overlay 706 is placed over the surface of target 410 shown in the photograph of FIG. 6. The dark areas in the photographs of FIGS. 6 and 7 are due to redeposition, while the light areas are due to erosion. Grid overlay 706 may be placed over the target to trace the dark and light areas of the target thereon. The tracing on grid overlay 708 may then be transferred to a graphing paper, for example, for recording and further analysis. FIG. 8 shows an example where the tracing on grid overlay 706 has been transferred to a circular graphing paper 803, in accordance with an embodiment of the present invention. Graphing paper 803 may have finer units than grid overlay 706 to allow for more precise recording of static erosion profile.

It is to be noted that a two-dimensional static erosion profile may also be generated by measuring the surface of the target before and after sputtering. Such measurements may be made using a coordinate measuring machine (CMM), for example.

Figure 9A:
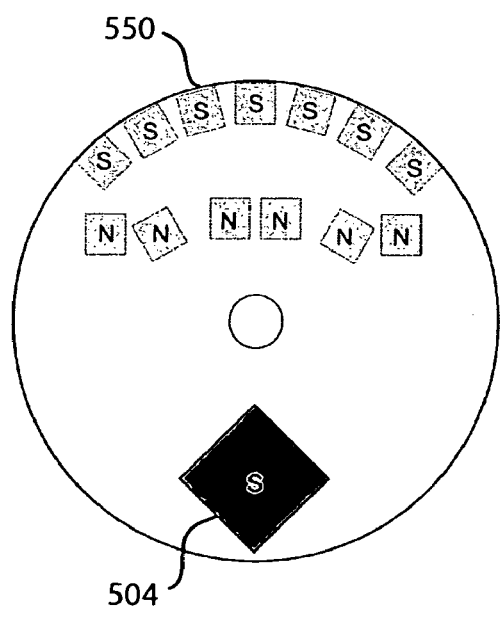
FIG. 9, which consists of FIGS. 9($a$) and 9($b$), pictorially illustrates optimization of erosion profile by making adjustments to a rotating magnetic array, in accordance with an embodiment of the present invention.
Figure 9B:
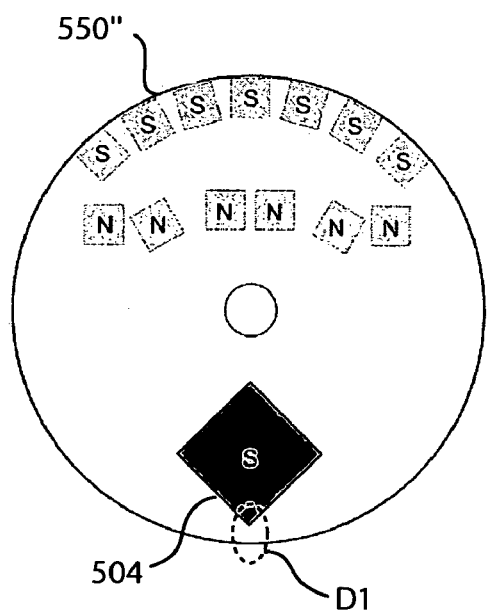

Using information from recorded erosion profiles, adjustments to sputtering tracks may be made to optimize the erosion of a shaped target. FIG. 9, which consists of FIGS. 9(a) and 9(b), pictorially illustrates optimization of an erosion profile by making adjustments to a rotating magnetic array. Magnetic array 550 (see also FIG. 5) is shown in FIG. 9(a) for ease of comparison with magnetic array 550", which is shown in FIG. 9(b). Magnetic array 550" is identical to magnetic array 550 except that in magnetic array 550" magnet 504 was moved up a distance D1. In one embodiment, distance D1 is about ⅛ inch. Although magnet 504 was moved a small amount in magnetic array 550", the move has a measurable effect on the erosion profile.

Figure 10:
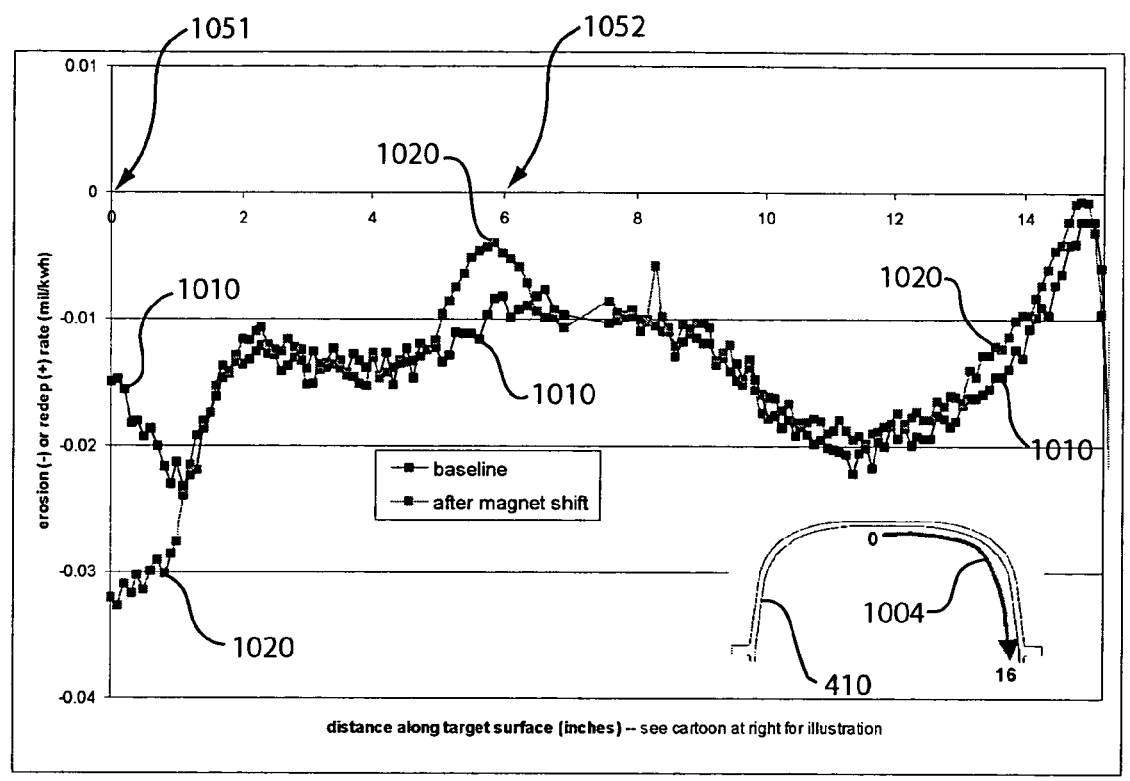
FIG. 10 shows plots of example erosion profiles, illustrating the effect of adjusting a magnet of a rotating magnetic array.

In FIG. 10, erosion profile 1010 is for a target 410 used in conjunction with a rotating magnetic array 550, while erosion profile 1020 is for a target 410 used in conjunction with a rotating magnetic array 550". Both magnetic arrays were rotated for this experiment. A target 410 is schematically drawn on the lower right corner of the erosion profiles for ease of understanding. Erosion profiles 1010 and 1020 were generated by making CMM measurements on the surface of the respective targets 410 before and after sputtering. In FIG. 10, the horizontal axis represents a position along target 410 labeled by arrow 1004. The numbers on arrow 1004 and the horizontal axis are in inches. The vertical axis represents the redeposition (positive value) or erosion (negative value) rate on the sputtering surface of target 410. Inspection of erosion profiles 1010 and 1020 indicates that moving magnet 504 significantly changes the erosion profile at the center of the dome (i.e., at about 0 inch; see arrow 1051) and at the outside of the dome (i.e., at about 6 inches, see arrow 1052). This indicates that magnet 504 may be adjusted to change the shape and location of an inner plasma loop, such as plasma loop 435 shown in FIG. 4.

For erosion profile 1010, which corresponds to the erosion shown in the photograph of FIG. 7, the center of the dome is on the very edge of the erosion band created by the inner plasma loop. However, if magnet 504 is shifted toward the center of the target by ⅛", then this erosion band will also shift by ⅛", putting the center of the target closer to the middle of the erosion band, where the erosion rate is higher. This is reflected in the erosion profiles shown in FIG. 10, where the erosion at 0 inch for profile 1020 (magnetic array 550") is much higher than for profile 1010 (magnetic array 550).

Shifting an inner plasma loop toward the center of the target increases the erosion near the center of the target, and decreases erosion further out. In the example of FIG. 7, each circle of grid overlay 706 corresponds to an inch. That means the outer edge of the inner plasma loop is approximately 6 inches from the center of the grid overlay 706 (and also at approximately 6 inches in the horizontal axis of the erosion profiles shown in FIG. 10; see arrow 1052). Shifting magnet 504 toward the target center, and therefore the erosion of the inner plasma ring, decreases the erosion at a location 6 inches from the center of the dome. This is reflected in FIG. 10 where the erosion at 6 inches is significantly reduced for magnet 550" (erosion profile 1020).

Figure 11:
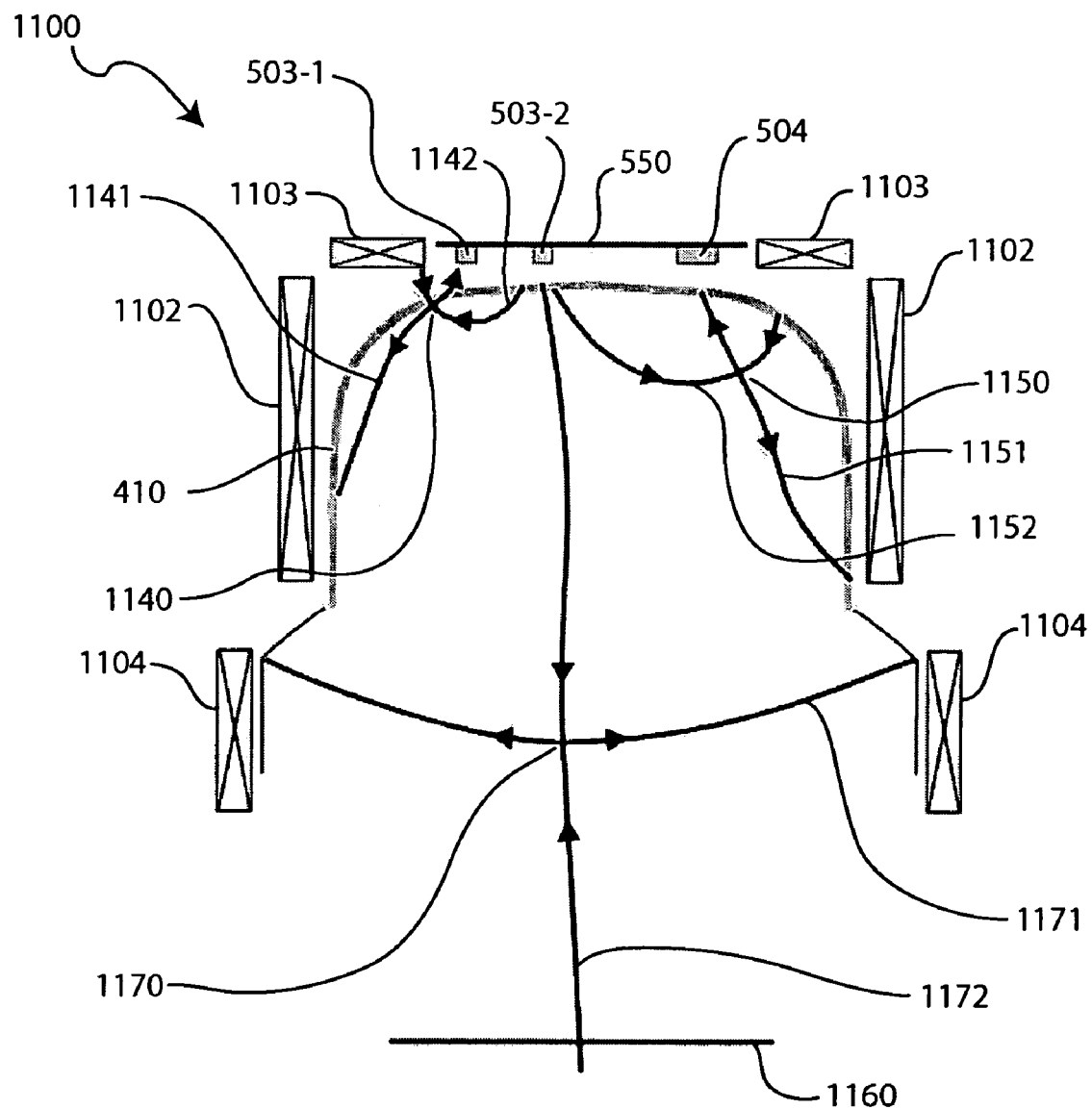
FIG. 11 shows a magnetron sputtering apparatus employing a rotating magnetic array, in accordance with an embodiment of the present invention.

FIG. 11 shows a magnetron sputtering apparatus 1100 employing a magnetic array 550 (see FIG. 5), in accordance with an embodiment of the present invention. Magnetic array 550 may be rotated using a motor, for example, to average the erosion profile on hollow cathode target 410. Magnets 503-1, 503-2, and 504 of magnetic array 550 have been discussed in connection with FIG. 5. In apparatus 1100, a hollow cathode target 410, an auxiliary magnet 1103, a main magnet 1102, and a control magnet 1104 are cylindrically symmetric. The teachings of the present disclosure may be employed together with the teachings of U.S. Pat. Nos. 6,497,796, 6,179,973, and 6,193,854, which are incorporated herein by reference in their entirety, to build apparatus 1100. It should be understood, however, that the present invention is not so limited and may be generally employed in other magnetron sputtering apparatus.

In apparatus 1100, magnets 1102 and 1104 generate magnetic fields to form a separatrix 1171 that confine an outer closed plasma loop (e.g., see plasma loop 405 shown in FIG. 4). Plasma confined by separatrix 1171 escapes out of target 410 through a null region 1170 generally along the path of a magnetic field line 1172. Some of the escaping ions get deposited on a substrate 1160, which may be a semiconductor wafer. The magnetic field strength of control magnet 1104, which may be an electromagnetic coil, may be varied to control the shape of separatrix 1171 and thereby affect the profile of the escaping plasma. Separatrices and techniques for controlling them are also disclosed in the incorporated U.S. Pat. No. 6,179,973.

Auxiliary magnet 1103 and the magnets of magnetic array 550 are configured to form a separatrix 1142 and a separatrix 1152. Separatrix 1142 and separatrix 1152 pass through null regions 1140 and 1150, respectively. Plasma may escape out of separatrix 1142 by following the path of a magnetic field line 1141. Similarly, plasma may escape out of separatrix 1152 by following the path of a magnetic field line 1151.

Figure 12:
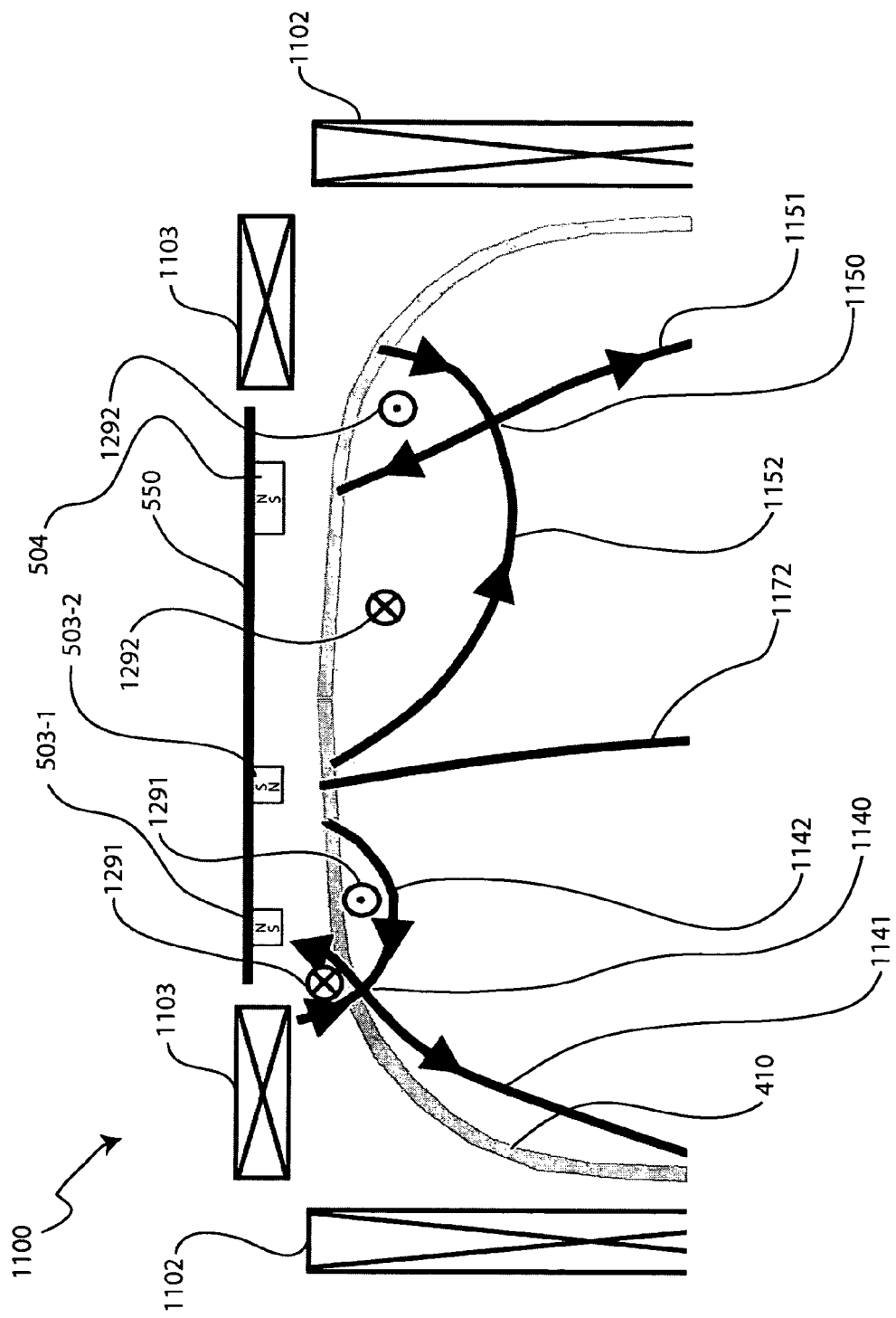
FIG. 12 shows a magnified view of the apparatus of FIG. 11.

FIG. 12 shows a magnified view of the top portion of apparatus 1100. As shown in FIG. 12, separatrix 1142 is formed such that one side of it is cut off by the face of target 410. This results in a plasma loop 1291 that would otherwise flow going into the page of FIG. 12 (see the circled X labeled 1291) and coming out of the page of FIG. 12 (see the circled dot labeled 1291) to be also cut off. Plasma loop 1291 does not have a return path and thus becomes an open plasma loop flowing in only one direction across target 410 (see plasma loop 425 of FIG. 4). On the other hand, separatrix 1152 is not cut off. This allows plasma loop 1292 confined by separatrix 1152 to flow in a direction going into the page of FIG. 12 (see circled X labeled 1292) and coming out of the page of FIG. 12 (see circled dot labeled 1292). Plasma loop 1292 has an unblocked return path and is thus a closed plasma loop (see plasma loop 435 of FIG. 4). By adjusting the shape and location of plasma loops 1291 and 1292, the erosion profile on target 410 may be optimized. As mentioned, such optimization may be performed by generating dynamic or static erosion profiles, and making adjustments to corresponding magnetic circuits influencing those erosion profiles. The other labeled features in FIG. 12 have already been introduced and discussed in connection with FIG. 11.

In light of the foregoing, it can be appreciated that it is possible to achieve full face erosion using different combinations of top rotating magnetic arrays and main magnetic field strengths. For example, both erosion profiles 1010 and 1020 shown in FIG. 10 result in full face erosion despite different configurations of rotating magnetic arrays. The optimum magnetic configuration will depend on the requirements of the particular application.

Figure 13:
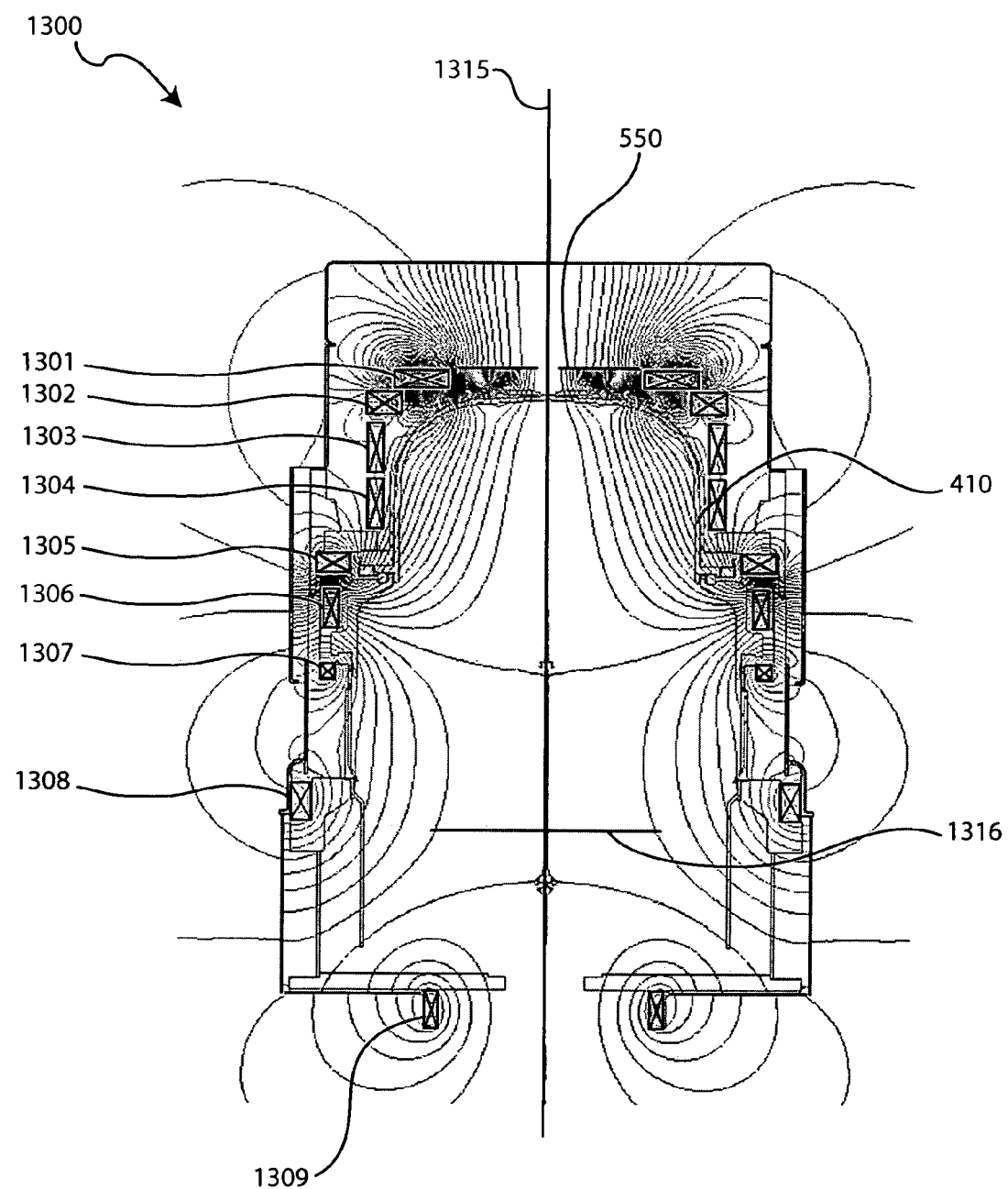
FIG. 13 shows a schematic diagram of a hollow cathode magnetron (HCM) apparatus in accordance with an embodiment of the present invention.

FIG. 13 shows a schematic diagram of a hollow cathode magnetron (HCM) apparatus 1300 in accordance with an embodiment of the present invention. HCM apparatus 1300 includes a target 410 and a rotating magnetic array 550. HCM apparatus 1300 further includes cylindrically symmetric electromagnetic coils 1301-1309. A layer of magnetic shielding may surround the outside of coils 1301-1309. Apparatus 1300 is drawn in FIG. 13 as a two-dimensional axisymmetric model, and therefore only includes a symmetric approximation of the (asymmetric) rotating magnetic array 550. The axisymmetry of apparatus 1300 is indicated by center line 1315.

Still referring to FIG. 13, the prevailing magnetic field inside the volume of target 410 is generated by coils 1301-1305. This prevailing field is principally in the vertical direction in order to be roughly parallel to the sidewalls of target 410. One way of generating this prevailing field is to drive current of the same polarity through coils 1301-1305, with the current direction being clockwise as viewed from above the dome (i.e., from the top or closed end) of target 410. However, in the example of FIG. 13, the polarity of coil 1302 is reversed compared to that of coils 1301, 1303, 1304, and 1305. This pulls the nearby field lines closer to coil 1302 and, as a result, the magnetic field is roughly parallel to the target surface even at the corner of target 410. Keeping the field lines roughly parallel to the sidewalls and corner of the target helps keep the outer plasma loop 405 shown in FIG. 4 spread out over the entire sidewall and corner area. If coil 1302 were not reversed, the tendency would be for the sidewall to erode but the corner to have redeposition.

One of the main contributors to the magnetic field in the volume of the target 410 is the rotating magnetic array 550, which has its strongest influence over the erosion of the target dome. To some extent, the overall sputtering discharge is made up of two competing plasma regions—the first being around the sidewall and corner area of the target (e.g., outer plasma loop 405 and open plasma loop 425 shown in FIG. 4) and the second being a ring on the dome (e.g., inner plasma loop 435 shown in FIG. 4). One of the requirements for eroding the entire target surface is properly balancing the strength of these two competing plasma regions.

Still referring to the example of FIG. 13, coils 1306-1308 are in the opposite polarity compared to coils 1301, 1303, 1304, and 1305. Coils 1306-1308 form and shape the separatrix below the mouth of the target 410 and have a strong influence over the on-wafer uniformity of the process. Although coils 1306-1308 do not strongly influence the magnetic field in the target volume, they can have a significant effect on the erosion profile of the target. By tuning the position and shape of the separatrix, these coils strongly affect the confinement of the plasma in an outer plasma loop 405 (FIG. 4) and the impedance of the overall sputtering discharge, which in turn can have significant effects on the overall erosion profile of the target.

In the example of FIG. 13, coil 1309 is relatively far from target 410, and therefore has a smaller (though non-negligible) effect on the erosion profile. Its primary purpose is to tune the plasma near the substrate 1316.

Figure 14:
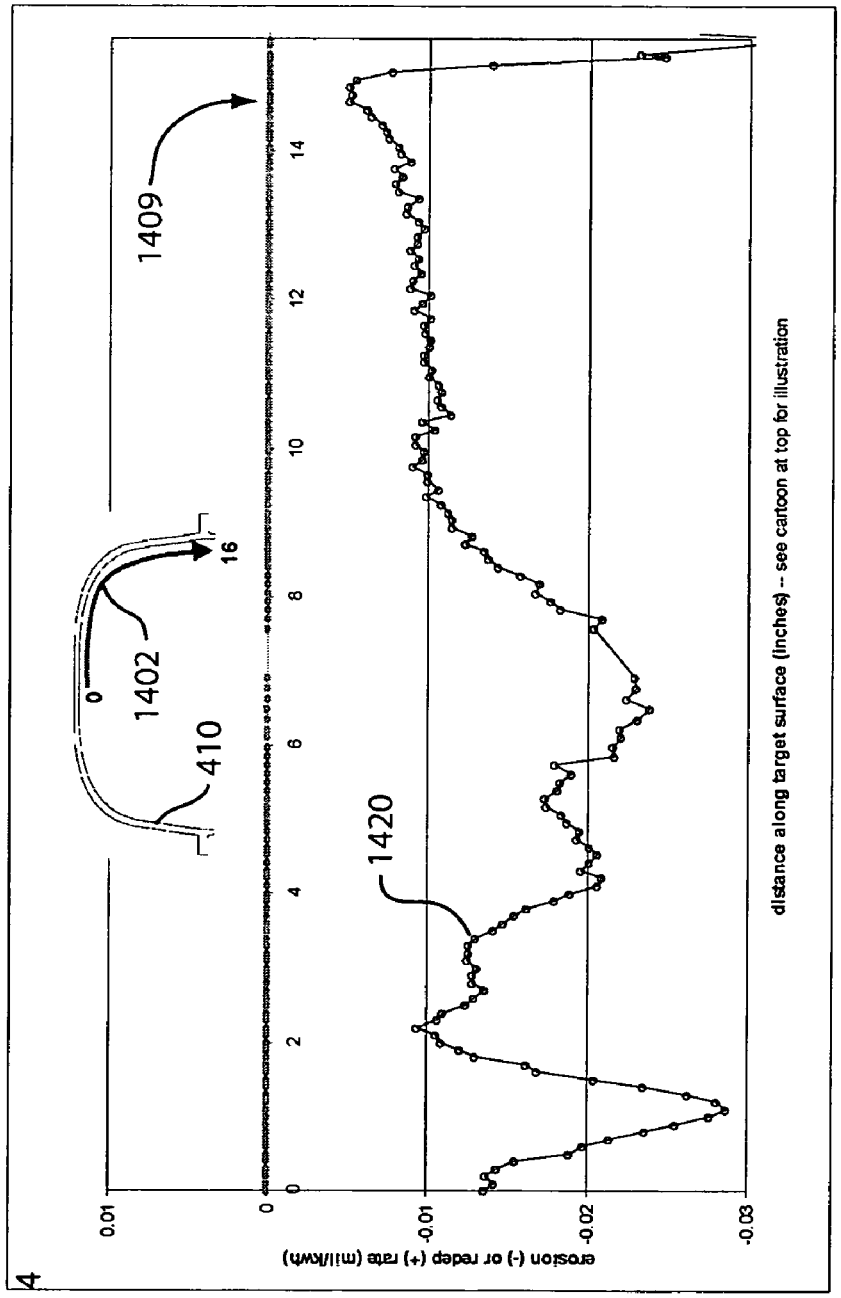
FIG. 14 shows a plot of an example erosion profile.

FIG. 14 shows an example erosion profile 1420 on a target 410. A target 410 is schematically drawn above the erosion profile for ease of understanding. Erosion profile 1420 was generated by making CMM measurements on the surface of the target 410 before and after sputtering. As in the previously described erosion profiles, the horizontal axis represents a position along target 410 labeled by arrow 1402. Although erosion profile 1420 results in full face erosion, there is room for improvement because the erosion rate near the lip of the target (at about 14.5 inches; see arrow 1409) is relatively low. This could present a problem because it limits the process window available to optimize process parameters while maintaining full face erosion.

In general, magnetrons with a concavely shaped target (e.g., a hollow cathode target) and a separatrix across the end of the target are susceptible to this lip erosion issue. The net erosion at any point on the target is equal to the difference between the sputtering rate at that point and the redeposition rate, and while the redeposition rate is similar along the entire sidewall and lip, the erosion rate tends to decrease close to the lip. This is because the plasma escapes to the anode when it is near the edge of the lip, so the plasma sputtering the lip tends to be weaker than that sputtering the rest of the target.

One way of increasing the erosion rate at the lip of a concavely shaped target is by lowering the separatrix that goes across the target mouth, pushing it lower onto the anode (i.e., towards the target). This puts more plasma at the lip, increasing the sputtering in that area. Techniques for controlling a separatrix at the mouth of a hollow cathode target are disclosed in the incorporated U.S. Pat. No. 6,179,973.

Figure 15:
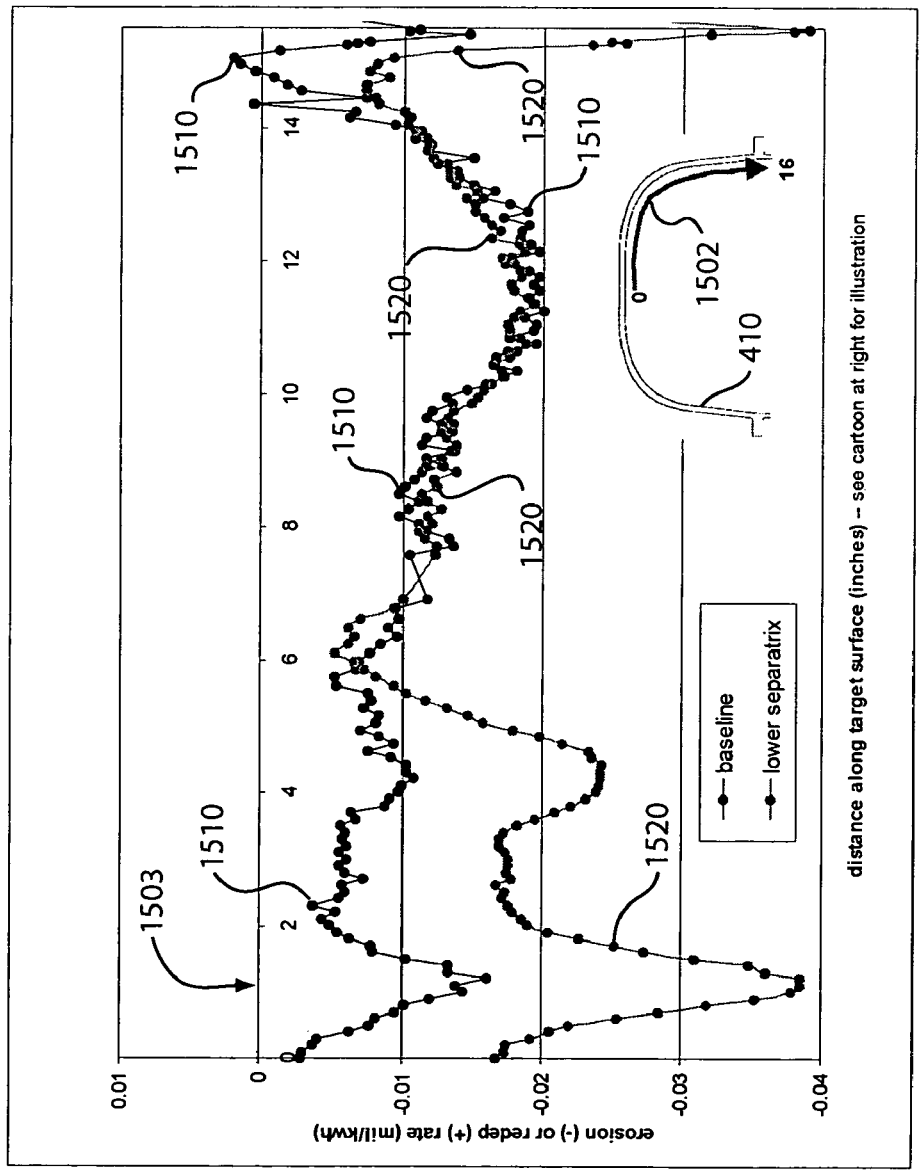
FIG. 15 shows plots of example erosion profiles, illustrating the effect of adjusting a separatrix to increase erosion on a lip of a hollow cathode target.

FIG. 15 shows erosion profiles 1510 and 1520 of hollow cathode targets 410 in one experiment. The targets 410 were essentially the same except that the one for erosion profile 1520 was configured to have a lowered separatrix at the lip. As in the previously described erosion profiles, the horizontal axis represents a position along target 410 labeled by arrow 1502. A target 410 is schematically drawn on the lower right corner of the erosion profiles for ease of understanding.

In the case of erosion profile 1510 (baseline), there is some redeposition at the lip of the target (i.e., at about 14.5 inches). As mentioned, in the case of erosion profile 1520, the magnetic field is adjusted to push the separatrix down a bit towards the substrate. Pushing the separatrix down results in erosion at the lip of the target, but also has some effect on the erosion near the top of the target (at about 0 to 2 inches; see generally arrow 1503). The change to the erosion at the top of the target may not be a problem, and could be adjusted by changing the magnetic field near the top of the target. However, besides adjusting the erosion profile, pushing the separatrix down will also allow more plasma to escape to the anode. This can have bad process consequences, including raising process voltage, decreasing the ionization efficiency of the source, and causing plasma instability.

Figure 16:
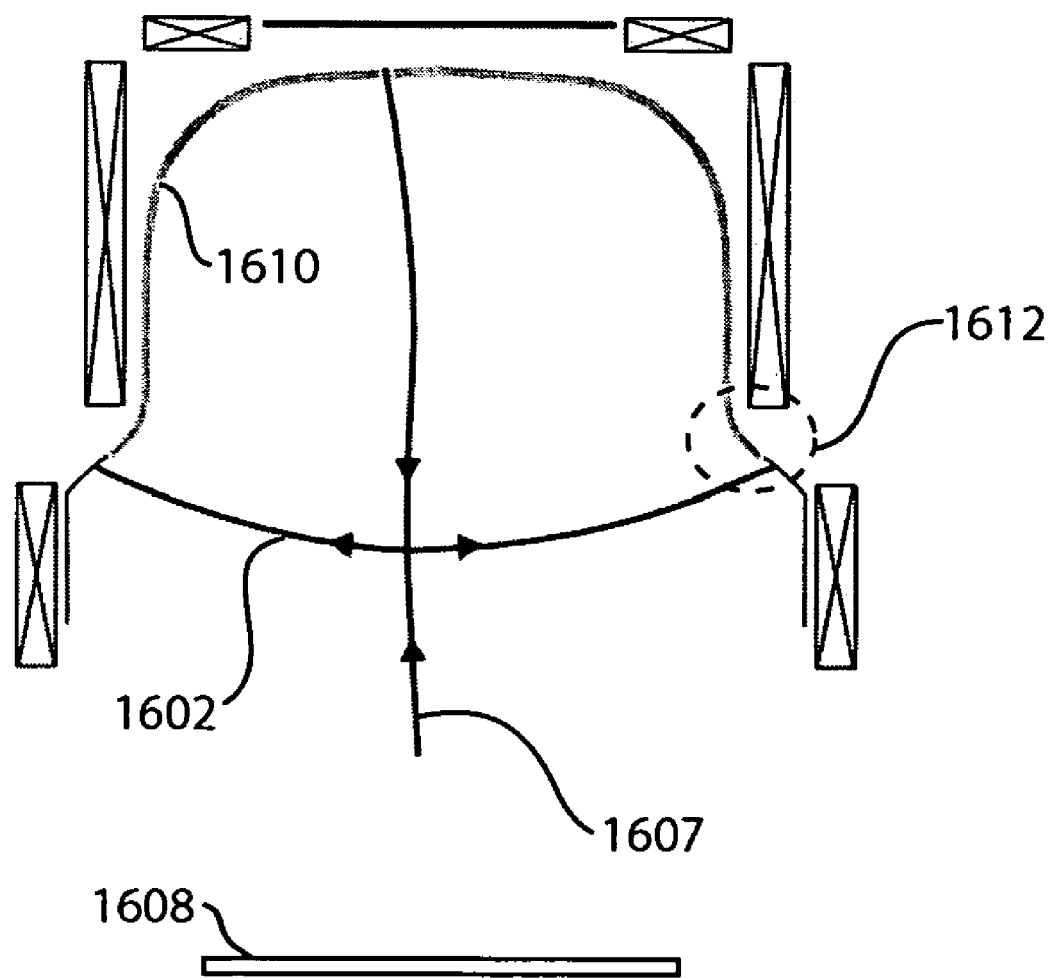
FIG. 16 shows a schematic diagram of a hollow cathode magnetron apparatus, in accordance with an embodiment of the present invention.

Another way of increasing the erosion rate at the lip of a concavely shaped target is to change the geometry of the target near the lip. FIG. 16 shows a schematic diagram of a hollow cathode magnetron apparatus 1600 in accordance with an embodiment of the present invention. Apparatus 1600 is cylindrically symmetric except for the top magnet. Apparatus 1600 includes a hollow cathode target 1610 with a flared lip (see lip bounded by dashed circle 1612). In the example of FIG. 16, the flared lip of target 1610 bends away from the sidewall surface of target 1610. The line of sight to the rest of the target is reduced at the flared lip, thereby decreasing the redepositing flux. With little or no change in the sputtering rate at the lip, this results in significantly increased net erosion at the lip.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of optimizing an erosion profile in a magnetron sputtering apparatus, the method comprising:
   providing a magnetron apparatus having a shaped target;
   sputtering a first portion of the shaped target using a first closed plasma loop;
   sputtering a second portion of the shaped target using an open plasma loop;
   recording an erosion profile of the shaped target by tracing on a grid overlay; and
   adjusting a magnetic configuration of the sputtering apparatus to adjust the first closed plasma loop based on the recording.

2. The method of claim 1 further comprising:
   sputtering a third portion of the shaped target using a second closed plasma loop that encircles the first closed plasma loop.

3. The method of claim 2 wherein the third portion includes a sidewall of the shaped target.

4. The method of claim 1 wherein the first portion includes a dome portion of the shaped target.

5. The method of claim 1 wherein the shaped target comprises a hollow cathode target having a dome, a mouth, and a sidewall joining the dome and the mouth, and wherein a lip of the mouth is flared.

6. The method of claim 1 wherein the shaped target is concave.

7. The method of claim 1 further comprising influencing the shape of the first closed plasma loop using a rotating magnetic array positioned on a closed end of the shaped target.

8. A method of optimizing an erosion profile of a shaped target of a magnetron sputtering apparatus, the method comprising:
   generating a record of an erosion profile of a non-planar target by tracing a sputtering surface of the non-planar target on a grid overlay; and
   based on the record, adjusting a magnetic configuration of the non-planar target to adjust a first plasma loop used to sputter the non-planar target.

\* \* \* \* \*